United States Patent [19]

Kamoshida et al.

[11] 4,349,619
[45] Sep. 14, 1982

[54] PHOTORESIST COMPOSITION

[75] Inventors: Yoichi Kamoshida; Toshiaki Yoshihara, both of Yokohama; Yoshiyuki Harita, Kawasaki; Kunihiro Harada, Machida, all of Japan

[73] Assignee: Japan Synthetic Rubber Co., Ltd., Tokyo, Japan

[21] Appl. No.: 185,771

[22] Filed: Sep. 10, 1980

[30] Foreign Application Priority Data

Sep. 19, 1979 [JP] Japan .................................. 54-120406
Nov. 9, 1979 [JP] Japan .................................. 54-145051
Apr. 28, 1980 [JP] Japan .................................. 55-56682
Aug. 13, 1980 [JP] Japan .................................. 55-111386

[51] Int. Cl.³ .......................... G03C 1/70; G03C 1/71
[52] U.S. Cl. ..................................... 430/196; 430/270; 430/281; 430/286; 430/311; 430/927
[58] Field of Search ............... 430/196, 197, 284, 519, 430/270, 286, 311, 325, 326, 927

[56] References Cited

U.S. PATENT DOCUMENTS

| | | | |
|---|---|---|---|
| 3,711,287 | 1/1973 | Dunham et al. | 430/196 |
| 3,948,667 | 4/1976 | Ichikawa et al. | 430/196 |
| 4,268,603 | 5/1981 | Sato | 430/196 |
| 4,287,289 | 9/1981 | Sato | 430/196 |

FOREIGN PATENT DOCUMENTS 51-37562 10/1976 Japan .................................. 430/196

*Primary Examiner*—Mary F. Downey
*Attorney, Agent, or Firm*—Oblon, Fisher, Spivak, McClelland & Maier

[57] ABSTRACT

By adding a compound represented by the following general formulas:

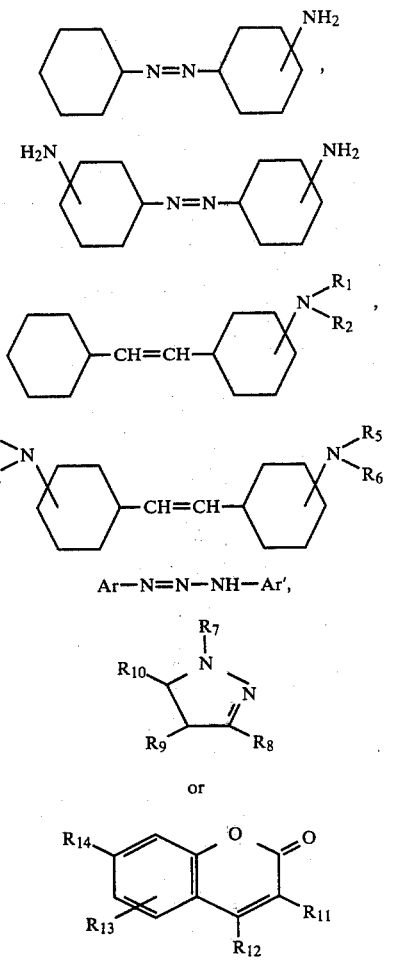

to a conventional photoresist composition comprising a cyclized product of conjugated diene polymer or copolymer and a photo-crosslinking agent soluble in an organic solvent, an image having a high degree of resolution and only a small number of pinholes can be obtained even when a base board having a surface of a high reflectance is used.

17 Claims, 1 Drawing Figure

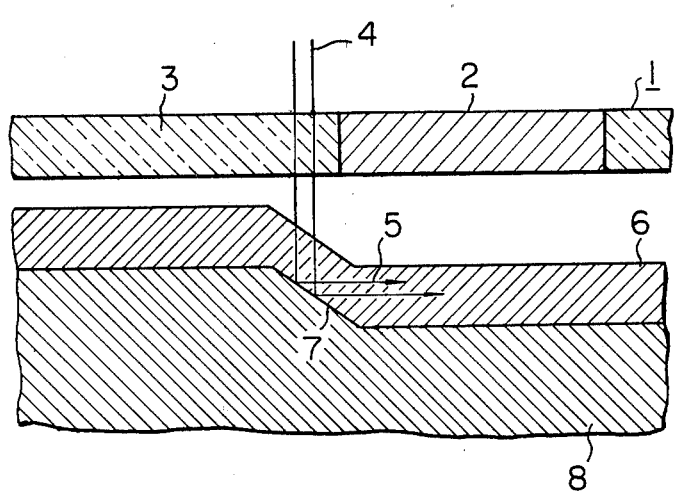

PHOTORESIST COMPOSITION

This invention relates to a photoresist composition. More particularly, it relates to a photoresist composition comprising a cyclized product of conjugated diene polymer or copolymer (hereinafter simply referred to as a conjugated diene polymer), an organic solvent soluble photo-crosslinking agent and a specific compound.

The progress in the technique for the production of integral circuits is so outstanding that the degree of integration is increasing at a rate of 2 times per year in the recent time. As a result an improvement is intensely requested not only in the technique of production but also in the apparatus used and the auxiliary materials. In the field of a photoresist, a composition excellent in handling and having a high degree of resolution is particularly requested. At present, in the production of integral circuits, a diazide compound-cyclized polyisoprene composition is used as a negative type photoresist composition and a quinonediazide compound-novolac resin composition is used as a positive type photoresist composition. Though the former is excellent in handling, it is low in degree of resolution particularly when the base board has a surface of a high reflectance (as referred to in this specification, the term "base board having a surface of a high reflectance" means that having a surface of a reflectance of 80% or more and more limitatively 90% or more against a light of 350–450 m$\mu$). Though the latter is excellent in degree of resolution, it is inferior in handling.

That is, if a diazide compound-cyclized polyisoprene type photoresist composition is used on a base board of a high reflectance such as aluminum, chromium and the like, the light reflected by the surface of the base board at the time of exposure goes round into the region which is not desired to be exposed to light (this phenomenon is called halation) and said region becomes exposed to light. This phenomenon is particularly marked on the steps of the base board and an exposed part called "spikes" is formed. Therefore, the degree of resolution is decreased.

With reference to the accompanying drawing, the above-mentioned phenomenon of halation will be explained. The drawing shows the cross-section of a photoresist structure, wherein 1 is a mask, 2 is a light shading part of the mask, 3 is a light transmitting part of the mask, 4 is an incident light, 5 is a reflected light, 6 is a photoresist composition, and 7 is the slant in the step structure part of a base board 8. The light 4 which has passed through the light transmitting part 3 of the mask and has entered the photoresist composition 6 is reflected by the slant 7 of the base board 8 and goes round under the light shading part 2 of the mask, whereby the photoresist composition of that part becomes exposed to light. That is, the region of the photoresist composition which is not intended to be exposed to light becomes exposed to light, whereby the degree of resolution is decreased.

In order to overcome this fault, the method of Japanese Patent Publication No. 37,562/76 was proposed. This technique is intended to overcome the above-mentioned fault by adding a light absorbing material to a photoresist composition and thereby decreasing the light transmittance of the coating film of the photoresist composition. According to this method, the light which has been reflected by the surface of the base board and passed through the coating film of the photoresist composition is absorbed by the light absorbing material and attenuated rapidly, so that the decrease in resolution due to the light going round into the region not intended to be exposed to light can be prevented. On the contrary, however, there arise various faults such as an increase of pinhole in the photoresist composition film, a decrease of sensitivity due to the drop in light transmittance of photoresist composition, a decrease in yield of the residual resist thickness, a decrease in the adhesion of photoresist composition to base board, etc. Further, there are additional inevitable problems that the light absorbing materials referred to in the above-mentioned patent such as oil-soluble dye Oil Yellow (a trade name for p-diethylaminoazobenzene) are lost by vaporization from the photoresist composition film upon prebaking to which a photoresist composition applied to the base board must be subjected at 80°–100° C. for the sake of eliminating the residual solvent, so that the amount of the anti-halation reagent is insufficient and is so greatly affected by the conditions for the prebaking treatment as to give only a poor reproducibility, etc. These were the important faults of the prior art.

The present inventors have studied the method for overcoming the above-mentioned faults, and found that an image having a high degree of resolution can be obtained by using a composition obtained by adding a specific compound to a photoresist composition comprising a cyclized product of a conjugated diene polymer and a photo-crosslinking agent soluble in an organic solvent, even when a base board having a surface of a high reflectance is used.

According to this invention, there is provided a photoresist composition which comprises a cyclized product of a conjugated diene polymer, a photo-crosslinking agent soluble in an organic solvent and at least one member selected from the group consisting of compounds represented by the formulas:

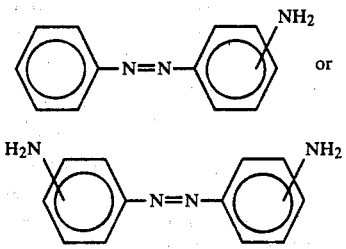

compounds represented by the formulas:

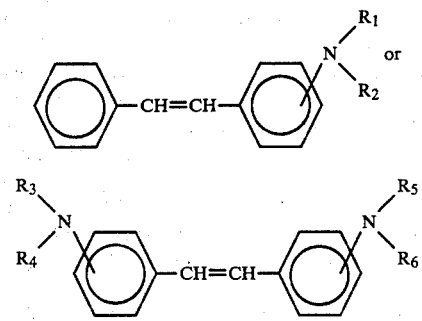

wherein $R_1$, $R_2$, $R_3$, $R_4$, $R_5$ and $R_6$, which may be identical or different, represent substituents selected from the group consisting of hydrogen atom and alkyl groups; compounds represented by the formula:

wherein Ar and Ar', which may be identical or different, represent aromatic groups; and compounds represented by the formula:

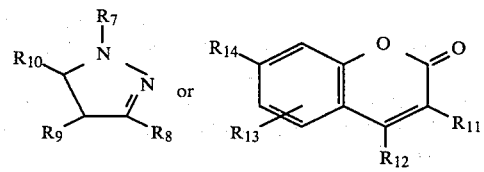

wherein $R_7$, $R_8$, $R_9$, $R_{10}$, $R_{12}$ and $R_{13}$, which may be identical or different, represent substituents selected from the group consisting of hydrogen atom, alkyl groups, alkenyl groups, aryl groups and aralkyl groups; $R_{11}$ is a substituent selected from the group consisting of hydrogen atom and aryl groups; and $R_{14}$ is a substituent selected from the group consisting of hydrogen atom and amino group.

The cyclized product of a conjugated diene polymer usable in this invention includes the cyclized products of polymers and copolymers which have the following unit in the polymer chain:

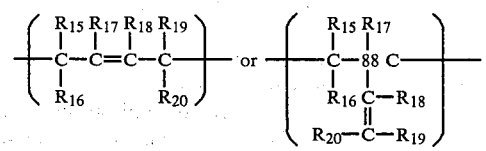

wherein $R_{15}$, $R_{16}$, $R_{17}$, $R_{18}$, $R_{19}$ and $R_{20}$, which may be identical or different, represent substituents selected from the group consisting of hydrogen atom, alkyl groups (as said alkyl group, lower alkyl groups such as methyl, ethyl and propyl are preferred) and aryl groups. Concrete examples of said cyclized product include cyclized products of polymers having cis-1,4-butadiene unit, trans-1,4-butadiene unit, cis-1,4-isoprene unit, trans-1,4-isoprene unit, cis-1,4-pentadiene unit, trans-1,4-pentadiene unit, 1,4-2-phenylbutadiene unit, 1,2-butadiene unit, 3,4-isoprene unit, 1,2-pentadiene unit, 3,4-2-phenylbutadiene unit and the like and cyclized products of copolymers having said conjugated diene units and a vinylaromatic compound unit such as styrene unit, α-methylstyrene unit and the like and an unsaturated monomer unit such as olefin unit (for example, ethylene unit, propylene unit, isobutylene unit or the like). Of course, a cyclized product of natural rubber can also be used. As said cyclized product of the conjugated diene polymer, cyclized products of polymers or copolymers having cis-1,4-isoprene unit, trans-1,4-isoprene unit, 3,4-isoprene unit, cis-1,4-butadiene unit, trans-1,4-butadiene unit or 1,2-butadiene unit are preferable, among which cyclized products of isoprene polymer or butadiene polymer are particularly preferable.

The amount of residual double bond in the above-mentioned cyclized product of the conjugated diene polymer is not critical. However, it is preferably 5–95%, more preferably 10–90% and most preferably 15–50%. The amount of residual double bond is expressed by the following formula:

$$\frac{\text{Proportion of the hydrogen atoms combined to unsaturated carbon to the total hydrogen atoms of cyclized product of the conjugated diene polymer*}}{\text{Proportion of the hydrogen atoms combined to unsaturated carbon to the total hydrogen atoms of raw diene polymer*}} \times 100$$

(*: measured by NMR)

The photo-crosslinking agents soluble in an organic solvent usable in this invention are azide type photosensitive materials, such as 4,4'-diazidostilbene, p-phenylenebisazide, 4,4'-diazidobenzophenone, 4,4'-diazidodiphenylmethane, 4,4'-diazidochalcone, 2,6-bis(4'-azidobenzal)cyclohexanone, 2,6-bis(4'-azidobenzal)-4-methylcyclohexanone, 4,4'-diazidodiphenyl, 4,4'-diazido-3,3'-dimethyldiphenyl, 2,7-diazidofluorene and the like. However, they are not limited to the above-mentioned photo-crosslinking agents, but all the photo-crosslinking agents may be used so far as they can exhibit an effect when combined with the cyclized product of the conjugated diene polymer used in this invention. All these photo-crosslinking agents are generally used in an amount of 0.1–10 parts by weight, preferably 1–3 parts by weight per 100 parts by weight of the cyclized product of the conjugated diene polymer.

As the compound represented by the formulas:

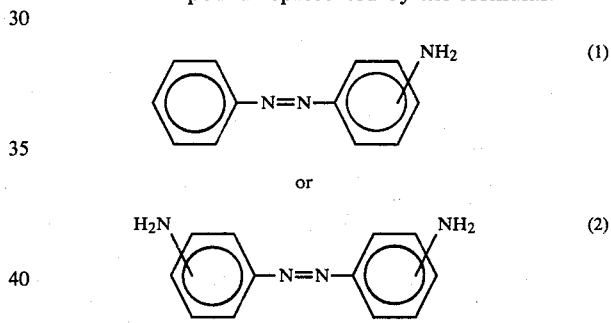

to be added to the photoresist composition comprising the above-mentioned cyclized product of the conjugated diene polymer and the photo-crosslinking agent soluble in an organic solvent, 2-aminoazobenzene, 3-aminoazobenzene, 4-aminoazobenzene, 2,2'-diaminoazobenzene, 2,4-diaminoazobenzene, 4,4'-diaminoazobenzene and the like can be referred to, among which 4-aminoazobenzene and 4,4'-diaminoazobenzene are particularly preferable because they are readily available.

By adding a compound represented by the above-mentioned formula (1) or (2) to the photoresist composition, there can be obtained an image having a high degree of resolution and only a small number of pinholes even when a base board having a surface of high reflectance is used.

As the compound represented by the formulas:

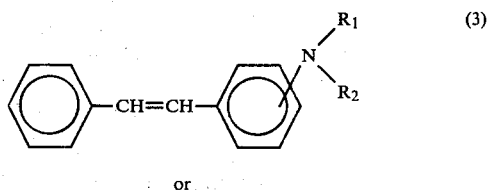

or

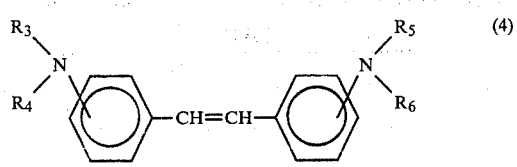

(4)

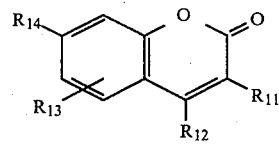

(7)

wherein $R_1$, $R_2$, $R_3$, $R_4$, $R_5$ and $R_6$ are as defined above, those having $R_1$, $R_2$, $R_3$, $R_4$, $R_5$ and $R_6$ being selected from the group consisting of hydrogen atom, methyl and ethyl are preferable, and include aminostilbene, 4,4′-diaminostilbene, 2,4′-diaminostilbene, dimethylaminostilbene, 4,4′-bis(dimethylamino)stilbene, 2,4′-bis(dimethylamino)stilbene, diethylaminostilbene, 4,4′-bis(diethylamino)stilbene, 2,4′-bis(diethylaminostilbene, 4-amino-4′-(N,N-dimethylamino)stilbene and the like, among which dimethylaminostilbene is particularly preferable because it is readily available.

By adding a compound represented by the above-mentioned formula (3) or (4) to the photoresist composition, an image having only a small number of pinholes and a high degree of resolution can be obtained even when a base board having a surface of a high reflectance is used and, in addition, the decrease in the sensitivity of photoresist composition is small.

As the compound represented by the formula:

wherein Ar and Ar′ are as defined above, preferred are compounds in which Ar and Ar′ are selected from the group consisting of phenyl, methylphenyl, dimethylphenyl, ethylphenyl, nitrophenyl, naphthyl, methylnaphthyl, dimethylnaphthyl, ethylnaphthyl and nitronaphthyl, and include diazoaminobenzene, 4,4′-dimethyldiazoaminobenzene, 2,4′-dimethyldiazoaminobenzene, 2,4-dimethyldiazoaminobenzene, 4,4′-diethyldiazoaminobenzene, 4,4′-dinitrodiazoaminobenzene, 1,1′-diazoaminonaphthalene, 4,4′-dimethyl-1,1′-diazoaminonaphthalene, 4,4′-diethyl-1,1′-diazoaminonaphthalene, 4,4′-dinitro-1,1′-diazoaminonaphthalene and the like, among which diazoaminobenzene and 4,4′-dimethyldiazoaminobenzene and particularly preferable because they are readily available.

By adding a compound represented by the above-mentioned formula (5) to the photoresist composition, an image having only a small number of pinholes and a high degree of resolution can be obtained even when a base board having a surface of a high reflectance is used and, in addition, there occurs no decrease of adhesion.

The compound represented by the formulas:

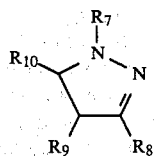

(6)

or wherein $R_7$, $R_8$, $R_9$, $R_{10}$, $R_{11}$, $R_{12}$, $R_{13}$ and $R_{14}$ are as defined above, includes, for example, 1,3-diphenylpyrazoline, 1,3,5-triphenylpyrazoline, 1-phenyl-3-m-tolylpyrazoline, 1-m-tolyl-3-phenylpyrazoline, 1-phenyl-3-p-bromophenylpyrazoline, 1,3-di-m-tolylpyrazoline, 1,3-diphenyl-5-methylpyrazoline, 1,5-diphenyl-3-p-tolylpyrazoline, 1,5-diphenyl-3-p-methoxyphenylpyrazoline, 1,5-diphenyl-3-p-ethoxyphenylpyrazoline, 1,5-diphenyl-3-p-phenoxyphenylpyrazoline, 1,5-diphenyl-3-(p-phenyl)phenylpyrazoline, 1,5-diphenyl-3-(p-ethoxy-m-methyl)phenylpyrazoline, 1-phenyl-3,5-di-(p-chlorophenyl)phenylpyrazoline, 1,3-diphenyl-5-p-methoxyphenylpyrazoline, 1-phenyl-3-p-methoxyphenyl-5-p-tolylpyrazoline, 1-phenyl-3-p-tolyl-5-p-methoxyphenylpyrazoline, 1-phenyl-3,5-di-(p-methoxyphenyl)pyrazoline, 1,5-diphenyl-3-α-naphthylpyrazoline, 1,5-diphenyl-3-β-naphthylpyrazoline, 1,3,4,5-tetraphenylpyrazoline, 1,3,5,5,-tetraphenylpyrazoline, 1,3,4-triphenylpyrazoline, 1,5-diphenyl-3-styrylpyrazoline, 1-β-naphthyl-3-styryl-5-phenylpyrazoline, 1-phenyl-3-chlorostyryl-5-phenylpyrazoline, 4-methyl-7-diethylaminocoumarin, 3-phenyl-7-acetylaminocoumarin, 3-p-tolyl-7-acetylaminocoumarin, 3-phenyl-4-methyl-7-diethylaminocoumarin, 3-p-tolyl-7-diethylaminocoumarin, 3-p-methoxyphenyl-4-ethyl-7-diethylaminocoumarin and the like. Among them, 1,3-diphenylpyrazoline, 1,3,5-triphenylpyrazoline, 1,5-diphenyl-3-p-tolylpyrazoline, 1,5-diphenyl-3-p-methoxyphenylpyrazoline and 4-methyl-7-diethylaminocoumarin are particularly preferable.

By adding a compound represented by the above-mentioned formula (6) or (7) to the photoresist composition, an image having a high degree of resolution can be obtained with a high reproducibility without being influenced by the conditions of prebaking even when a base board having a surface of a high reflectance is used and, in addition, there occurs no decrease of adhesion of the photoresist composition to the base board.

These compounds are used preferably in an amount of 0.1–10 parts by weight and particularly preferably in an amount of 1–5 parts by weight per 100 parts by weight of the cyclized product of the conjugated diene polymer.

When the above-mentioned compound (1), (2), (3), (4) or (5) is used, if the amount thereof is less than 0.1 part by weight the effect of their addition is small. If the amount exceeds 10 parts by weight, another disadvantage that the adhesion of the photoresist composition to the base board decreases can arise.

When the above-mentioned compound (6) or (7) is used, if the amount thereof is less than 0.1 part by weight, the effect of their addition is insufficient. If the amount exceeds 10 parts by weight, there can arise a disadvantage that the resist thickness remaining after development decreases.

A sensitizer may be added to the photoresist composition of this invention. Said sensitizer includes, for example, carbonyl compounds such as benzophenone, anthraquinone, 1,2-naphthoquinone, 1,4-naphthoquinone, 2-methylanthraquinone, benzanthrone, violanthrone, 9-anthraldehyde, benzil, p,p'-tetramethyldiaminobenzophenone, chloranil and the like; aromatic hydrocarbons such as anthracene, chrysene and the like; nitro compounds such as nitrobenzene, p-dinitrobenzene, 1-nitronaphthalene, p-nitrodiphenyl, 2-nitronaphthalene, 2-nitrofluorene, 5-nitroacenaphthene and the like; nitrogen compounds such as nitroaniline, 2-chloro-4-nitroaniline, 2,6-dichloro-4-nitroaniline, 5-nitro-2-aminotoluene, tetracyanoethylene and the like; sulfur compounds such as diphenyl disulfide and the like.

If necessary, a storage stabilizer may be added, which includes hydroxyaromatic compounds such as hydroquinone, methoxyphenol, p-t-butylcatechol and the like; quinone compounds such as benzoquinone, p-toluqinone, p-xyloquinone and the like; amine compounds such as phenyl-α-naphthylamine, p,p'-diphenylphenylenediamine and the like; sulfur compounds such as dilauryl thiodipropionate, 4,4'-thiobis(6-t-butyl-3-methylphenol), 2,2'-thiobis(4-methyl-6-t-butylphenol), 2-(3,5-di-t-butyl-4-hydroxyanilino)-4,6-bis(N-octylthio)-s-triazine and the like.

If the photoresist composition of this invention is used, the decrease in the degree of resolution due to halation can be prevented even on a base board of a high reflectance having a step structure, and some of the faults such as an increase of pinhole, a decrease in sensitivity due to the decrease in light transmittance, a decrease in the yield of the residual resist thickness, a decrease in adhesion of the photoresist composition to the base board, a deterioration in reproducibility due to the influence of prebaking treatment conditions, etc. can be overcome.

This invention will be illustrated in more detail with reference to Examples and Comparative Examples. The Examples are by way of illustration and not by way of limitation.

COMPARATIVE EXAMPLE 1

A photoresist composition was prepared by adding 0.22 g of 2,6-bis(4'-azidobenzal)cyclohexanone as a photo-crosslinking agent, 0.11 g of 2,2'-methylenebis(4-methyl-6-t-butylphenol) and 0.11 g of 4,4'-thiobis(2,6-di-t-butylphenol) as storage stabilizers and 88.6 g of xylene to 11.00 g of a cyclized product of cis-1,4-polyisoprene (residual double bond content 26%, $[\eta]_{xylene}^{30° C.}=0.72$ dl/g).

The photoresist composition thus prepared was applied with rotation by means of a spinner, so as to give a film thickness of 1.0 μm, to a silicon wafer with steps of 0.6 μm in height on which an aluminum layer having a thickness of 0.2 μm had previously been formed by vacuum deposition (reflectance 90%). Then it was dried at 80° C. for 15 minutes, and exposed to light by means of a super-high pressure mercury lamp at a light intensity of 50 W/m² through a resolution test chart chromium mask to print an image. After it was immersion-developed for 1 minute with Kodak Microresist Developer manufactured by Eastman Kodak Co., it was rinsed with n-butyl acetate for 1 minute and then the image formed was visually examined. The results were as shown in Table 1. When exposure time was 2.5 seconds, the yield of the residual resist thickness reached 90% or more, the degree of resolution in the flat part was 2.6 μm and the length of the region which had been exposed to the light going round into the masked region in the step part was 7 μm or more. The length of the region which had been exposed was determined by measuring the length of the region exposed to the light 5 from the slant 7 in the accompanying drawing.

TABLE 1

| | Run No. | Exposure time (sec) | Degree of[1] resolution (μm) | Length of[2] exposed region (μm) |
|---|---|---|---|---|
| Comparative Example 1 | 1 | 2.0 | 2.6 | >7 |
| | 2 | 2.5 | 2.9 | >7 |
| | 3 | 3.0 | 2.9 | >7 |

Note:
[1]The degree of resolution in the flat part (hereinafter the same applies.)
[2]The region exposed to the light going round into the masked region at the step part (hereinafter the same applies.)

As Run No. 4, the same photoresist composition as above was applied, so as to give a film thickness of 1.0 μm, in the same manner as in Run No. 1 to a silicon wafer having a silicon oxide film of 0.7 μm (reflectance 70%). It was dried at 80° C. for 15 minutes and then its whole surface was exposed to light by means of a super-high pressure mercury lamp at a light intensity of 50 W/m² for 2.5 seconds. Then it was developed and rinsed in the same manner as in the case of silicon wafer having a vacuum deposited aluminum layer, heat-treated under an atmosphere of nitrogen at 150° C. for 30 minutes, and etched with an etchant having a HF (49% aqueous solution)/NH$_4$F (40% aqueous solution) ratio of 1/6 by volume at 25° C. for 9 minutes (including 2 minutes for overetching). Then the photoresist composition was peeled off and the pinhole density was measured. It was found to be 0.5 pinhole/cm². The measurement of pinhole density was carried out by applying a direct current voltage of 60 V between the back side and the front side of the wafer in methanol and counting the number of places from which bubbles were emitted.

As Run No. 5, an image was printed and developed in the same manner as in Run No. 4. Then it was heat-treated under a nitrogen atmosphere at 150° C. for 30 minutes and etched with an etchant having a HF (49% aqueous solution)/NH$_4$F (40% aqueous solution)/water ratio of 1/6/10 by volume at 25° C. for 30 minutes. In this case, the side etch (a phenomenon that the part under the resist composition film is etched by the etchant going round thereinto) was 3.0 μm.

COMPARATIVE EXAMPLE 2

A photoresist composition was prepared by adding 0.22 g of 2,6-bis(4'-azidobenzal)cyclohexanone as a photo-crosslinking agent, 0.11 g of 2,2'-methylenebis(4-methyl-6-t-butylphenol) and 0.11 g of 4,4'-thiobis(2,6-di-t-butylphenol) as storage stabilizers, 0.55 g of p-diethylaminoazobenzene (trade name: Oil Yellow) as an anti-halation reagent and 88.1 g of xylene to 11.00 g of a cyclized product of cis-1,4-polyisoprene (residual double bond content 26%, $[\eta]_{xylene}^{30° C.}=0.72$ dl/g).

By using the photoresist composition thus prepared, an image was printed and developed on a silicon wafer having a vacuum deposited aluminum layer in the same manner as in Comparative Example 1, and the image was visually examined to obtain the results shown in Table 2. By prolonging the exposure time to 4.5 seconds, the yield of the residual resist thickness could be elevated to 90% or more. The degree of resolution in the flat part was 2.6 μm, and the length of the region exposed to the light going round into the masked region in the step part was 2 μm. Though the influence of the so-called halation due to the light going round became smaller, the sensitivity decreased, so that it was necessary to prolong the exposure time as above.

TABLE 2

| Run No. | Exposure time (sec) | Degree of resolution (μm) | Length of exposed region (μm) |
|---|---|---|---|
| Comparative Example 2 | 6 | 4.5 | 2.6 | 2 |
| | 7 | 5.5 | 2.9 | 3 |

As Run No. 8, the same photoresist composition as above was applied to a silicon wafer having a vacuum deposited aluminum layer in the same manner as in Comparative Example 1, and dried at 95° C. for 30 minutes, after which an image was printed and developed in the same manner as in Run No. 6. As a result, the degree of resolution was 2.9 μm and the length of the exposed region was 5 μm. It is understandable from the above that the halation-proofing effect is decreased under some prebaking conditions.

As Run No. 9, the procedure of Run No. 4 of Comparative Example 1 was repeated, except that the same photoresist composition as above was applied to a silicon wafer having a silicon oxide fim and exposed and developed in the same manner as in Run No. 6. The pinhole density was measured and found to be 2.0 pinholes/cm². It is understandable that the pinhole density increased though the influence of halation due to the light going round became smaller.

As Run No. 10, an image was printed and developed in the same manner as in Run No. 6 by using a silicon wafer having a silicon oxide film, and etching was carried out in the same manner as in Comparative Example 1 (Run No. 5) with an etchant having a HF (49% aqueous solution)/NH$_4$F (40% aqueous solution)/H$_2$O ratio of 1/6/10 by volume. As a result, the side etch was 5.0 μm. Though the influence of halation due to the light going round became smaller, the adhesion dropped and the side etch at the time of etching the silicon oxide film became greater.

EXAMPLE 1

A photoresist composition was prepared by adding 0.22 g of 2,6-bis(4'-azidobenzal)cyclohexanone as a photo-crosslinking agent, 0.11 g of 2,2'-methylenebis(4-methyl-6-t-butylphenol) and 0.11 g of 4,4'-thiobis(2,6-di-t-butylphenol) as storage stabilizers, an amount of 4-aminoazobenzene as an anti-halation reagent and an amount of xylene to 11.00 g of a cyclized product of cis-1,4-polyisoprene (residual double bond content 26%, $[\eta]_{xylene}^{30°\,C.} = 0.72$ dl/g).

By using the photoresist composition thus prepared, an image was printed and developed on a silicon wafer having a deposited aluminum layer in the same manner as in Comparative Example 1. The image was examined visually to obtain the results shown in Table 3. The yield of the residual resist thickness was 90% or more in all the cases, the degree of resolution was 2.2 μm and the length of the region exposed to the light going round into the masked region in the step part was 2 μm or less.

TABLE 3

| | Run No. | Amount of 4-amino-azobenzene (g) | Amount of xylene (g) | Exposure time (sec) | Degree of resolution (μm) | Length of exposed region (μm) |
|---|---|---|---|---|---|---|
| Example 1 | 11 | 0.33 | 88.2 | 3.0 | 2.2 | 1 |
| | 12 | 0.33 | 88.2 | 4.0 | 2.2 | 1-2 |
| | 13 | 0.55 | 88.0 | 5.0 | 2.2 | <1 |
| | 14 | 0.55 | 88.0 | 6.0 | 2.2 | <1 |

As Run No. 15, exposure and development were carried out in the same manner as in Run No. 13 by using the same silicon wafer having a silicon oxide film and the same photoresist composition as in Run No. 13, and the pinhole density was measured in the same manner as in Run No. 4 of Comparative Example 1. As a result, the pinhole density was found to be 0.5 pinhole/cm². It is understandable that the pinhole density was comparable to that in Run No. 4 of Comparative Example 1 and the formation of pinhole was smaller than that in Run No. 9 of Comparative Example 2.

EXAMPLE 2

A photoresist composition was prepared by repeating the procedure of Example 1, except that 4-aminoazobenzene was replaced by p-dimethylaminostilbene.

By using the photoresist composition thus prepared, an image was printed and developed in the same manner as in Comparative Example 1, and the image formed was examined visually to obtain the results shown in Table 4. In all the cases, the yield of the residual resist thickness was 90% or more, the degree of resolution in the flat part was 2.2 μm, and the length of the region exposed to the light going round into the masked region in the step part was 2 μm or less.

TABLE 4

| | Run No. | Amount of p-dimethyl-amino-stilbene (g) | Amount of xylene (g) | Exposure time (sec) | Degree of resolution (μm) | Length of exposed region (μm) |
|---|---|---|---|---|---|---|
| Example 2 | 16 | 0.33 | 88.2 | 2.5 | 2.2 | 1 |
| | 17 | 0.33 | 88.2 | 3.0 | 2.2 | 1-2 |
| | 18 | 0.55 | 88.0 | 3.0 | 2.2 | <1 |
| | 19 | 0.55 | 88.0 | 3.5 | 2.2 | <1 |

EXAMPLE 3

A good image having a high degree of resolution was obtained by repeating the procedure of Example 1, except that 4-aminoazobenzene was replaced by p-diethylaminostilbene. The results are shown in Table 5.

TABLE 5

| | Run No. | Amount of p-diethyl-amino-stilbene (g) | Amount of xylene (g) | Exposure time (sec) | Degree of resolution (μm) | Length of exposed region (μm) |
|---|---|---|---|---|---|---|
| Example 3 | 20 | 0.33 | 88.2 | 2.5 | 2.2 | 1 |
| | 21 | 0.33 | 88.2 | 3.0 | 2.2 | 1-2 |
| | 22 | 0.66 | 87.8 | 3.0 | 2.2 | <1 |
| | 23 | 0.66 | 87.8 | 3.5 | 2.2 | <1 |

EXAMPLE 4

A photoresist composition was prepared by adding 0.42 g of 2,6-bis(4'-azidobenzal)-4-methylcyclohexanone as a photo-crosslinking agent, 0.14 g of 2,2'- methylenebis(4-ethyl-6-t-butylphenol) and 0.14 g of 6-(4-hydroxy-3,5-di-t-butylanilino)-2,6-bisoctylthio-1,3,5-triazine as storage stabilizers, an amount of xylene and an amount of p-dimethylaminostilbene to 14.00 g of a cyclized product of cis-1,4-polybutadiene residual double bond content 34%, $[\eta]_{xylene}^{30°\,C.}=0.51$ dl/g).

By using the photoresist composition thus prepared, an image was printed on a silicon wafer having a deposited aluminum layer in the same manner as in Comparative Example 1. It was developed with a developing solution comprising 210 ml of n-heptane, 90 ml of decalin and 0.27 g of sorbitan monooleate for 1 minute, after which it was rinsed with n-butyl acetate for 1 minute and the image formed was examined visually. The results were as shown in Table 6. In all the cases, the yield of the residual resist thickness reached 90% or more, and halation could be prevented without decreasing the sensitivity.

TABLE 6

| | Run No. | Amount of p-dimethyl amino-stilbene (g) | Amount of xylene (g) | Exposure time (sec) | Degree of resolution (μm) | Length of exposed region (μm) |
|---|---|---|---|---|---|---|
| Example 4 | 24 | 0.52 | 84.9 | 2.5 | 2.2 | 1 |
| | 25 | 0.52 | 84.9 | 3.0 | 2.2 | 1-2 |
| | 26 | 0.70 | 84.7 | 2.5 | 2.2 | <1 |
| | 27 | 0.70 | 84.7 | 3.0 | 2.2 | <1 |

EXAMPLE 5

A good image having a high degree of resolution was obtained by repeating the procedure of Example 1, except that 4-aminoazobenzene was replaced by 4-amino-4'-(N,N-dimethylamino)-stilbene. The results are shown in Table 7.

TABLE 7

| | Run No. | Amount of 4-amino-4'-(N,N-dimethyl-amino)-stilbene (g) | Amount of xylene (g) | Exposure time (sec) | Degree of resolution (μm) | Length of exposed region (μm) |
|---|---|---|---|---|---|---|
| Example 5 | 28 | 0.66 | 87.8 | 3.0 | 2.2 | <1 |
| | 29 | 0.66 | 87.8 | 3.5 | 2.2 | <1 |

EXAMPLE 6

As Run No. 30, a good image having a high degree of resolution was obtained by repeating the procedure of Run No. 25 in Example 4, except that p-dimethylaminostilbene was replaced by p-aminostilbene. This silicon wafer carrying an image was heat-treated in a circulation type thermostat at 180° C. for 30 minutes and etched with phosphoric acid, after which the pinhole density was measured in the same manner as in Run No. 4 of Comparative Example 1. Thus, as good a result as 0.5 pinhole/cm² was obtained.

EXAMPLE 7

A photoresist composition was prepared by repeating the procedure of Example 1, except that 4-aminoazobenzene was replaced by diazoaminobenzene.

By using the photoresist composition thus prepared, an image was printed and developed on a silicon wafer having a vacuum-deposited aluminum layer in the same manner as in Comparative Example 1. The image formed was examined visually to obtain the results shown in Table 8.

TABLE 8

| | Run No. | Amount of diazo-amino-benzene (g) | Amount of xylene (g) | Exposure time (sec) | Degree of resolution (μm) | Length of exposed region (μm) |
|---|---|---|---|---|---|---|
| Example 7 | 31 | 0.33 | 88.2 | 3.0 | 2.2 | 1 |
| | 32 | 0.33 | 88.2 | 4.0 | 2.2 | 1-2 |
| | 33 | 0.55 | 88.0 | 5.0 | 2.2 | <1 |
| | 34 | 0.55 | 88.0 | 6.0 | 2.2 | <1 |

As Run No. 35, an image was printed and developed in the same manner as in Run No. 33 by using the same photoresist composition as in Run No. 33 and a silicon wafer having a silicon oxide film, and etching of the silicon oxide film was carried out in the same manner as in Run No. 5 of Comparative Example 1. As a result, the side etch was 3.0 μm and the adhesion was good.

EXAMPLE 8

A photoresist composition was prepared by repeating the procedure of Example 1, except that 4-aminoazobenzene was replaced by 4,4'-dimethyldiazoaminobenzene.

By using the photoresist composition thus prepared, an image was printed and developed on a silicon wafer having a vacuum deposited aluminum layer in the same manner as in Comparative Example 1. The results are shown in Table 9 to demonstrate that a good image having a high degree of resolution was obtained.

TABLE 9

| | Run No. | Amount of 4,4'-dimethyldiazo-aminobenzene (g) | Amount of xylene (g) | Exposure time (sec) | Degree of resolution (μm) | Length of exposed region (μm) |
|---|---|---|---|---|---|---|
| Example 8 | 36 | 0.33 | 88.2 | 3.0 | 2.2 | 1 |
| | 37 | 0.33 | 88.2 | 4.0 | 2.2 | 1-2 |
| | 38 | 0.66 | 87.8 | 5.0 | 2.2 | <1 |
| | 39 | 0.66 | 87.8 | 6.0 | 2.2 | <1 |

As Run No. 40, an image was printed and developed in the same manner as in Run No. 38 by using the same photoresist composition as in Run No. 38 and a silicon wafer having a silicon oxide film, and the silicon oxide film was etched in the same manner as in Run No. 5 of Comparative Example 1. As a result, the side etch was 3.0 μm and adhesion was good.

EXAMPLE 9

A photoresist composition was prepared by repeating the procedure of Example 4, except that p-dimethylaminostilbene was replaced by 1,1'-diazoaminonaphthalene. By using the photoresist composition thus prepared, an image was printed on a silicon wafer having a vacuum deposited aluminum layer and developed in the same manner as in Example 4. The results are shown in Table 10. As seen in Table 10, a good image having a high degree of resolution was obtained.

TABLE 10

| | Run No. | Amount of diazoamino-naphthalene (g) | Amount of xylene (g) | Exposure time (sec) | Degree of resolution (μm) | Length of exposed region (μm) |
|---|---|---|---|---|---|---|
| Example 9 | 41 | 0.52 | 84.9 | 4.0 | 2.2 | 1 |
| | 42 | 0.52 | 84.9 | 5.0 | 2.2 | 1-2 |

TABLE 10-continued

| Run No. | Amount of diazoamino-naphthalene (g) | Amount of xylene (g) | Exposure time (sec) | Degree of resolution (μm) | Length of exposed region (μm) |
|---|---|---|---|---|---|
| 43 | 0.70 | 84.7 | 5.0 | 2.2 | <1 |
| 44 | 0.70 | 84.7 | 6.0 | 2.2 | <1 |

As Run No. 45, the silicon wafer of Run No. 44, carrying an image, was heat-treated for 30 minutes at 150° C. in an atmosphere of nitrogen and then etched with phosphoric acid. The pinhole density was measured in the same manner as in Run No. 4 of Comparative Example 1, and there was obtained as good as result as 0.5 pinhole/cm².

EXAMPLE 10

A photoresist composition was prepared by repeating the procedure of Example 1, except that 4-aminoazobenzene was replaced by 4,4'-dinitrodiazoaminobenzene.

By using the photoresist composition thus prepared, an image was printed and developed in the same manner as in Comparative Example 1 on a silicon wafer having a deposited aluminum layer. The results are shown in Table 11 to demonstrate that a good image having a high degree of resolution was obtained.

TABLE 11

| | Run No. | Amount of 4,4'-dinitro diazoamino-benzene (g) | Amount of xylene (g) | Exposure time (sec) | Degree of resolution (μm) | Length of exposed region (μm) |
|---|---|---|---|---|---|---|
| Example 10 | 46 | 0.66 | 87.8 | 5.0 | 2.2 | <1 |
| | 47 | 0.66 | 87.8 | 6.0 | 2.2 | <1 |

As Run No. 48, the same photoresist composition as in Run No. 46 and a silicon wafer having a silicon oxide film were used, and the silicon oxide film was etched in the same manner as in Run No. 5 of Comparative Example 1. As a result, the side etch was 3.0 μm and the adhesion was good.

EXAMPLE 11

A photoresist composition was prepared by repeating the procedure of Example 1, except that 4-aminoazobenzene was replaced by 1,3,5-triphenylpyrazoline. By using the photoresist composition thus prepared, an image was printed and developed in the same manner as in Comparative Example 1 on a silicon wafer having a vacuum deposited aluminum layer. In all the cases, the yield of the residual resist thickness of the formed image was 90% or more. The results are shown in Table 12.

TABLE 12

| | Run No. | Amount of 1,3,5-triphenyl-pyrazoline (g) | Amount of xylene (g) | Exposure time (sec) | Degree of resolution (μm) | Length of exposed region (μm) |
|---|---|---|---|---|---|---|
| Example 11 | 49 | 0.33 | 88.2 | 3.0 | 2.2 | 1 |
| | 50 | 0.33 | 88.2 | 4.0 | 2.2 | 1-2 |
| | 51 | 0.55 | 88.0 | 5.0 | 2.2 | <1 |
| | 52 | 0.55 | 88.0 | 6.0 | 2.2 | <1 |

As Run No. 53, the same photoresist composition as in Run No. 49 was applied to a silicon wafer having a deposited aluminum layer in the same manner as in Comparative Example 1 and dried at 95° C. for 30 minutes, after which an image was printed and developed in the same manner as in Run No. 49. As a result, the degree of resolution was 2.2 μm and the length of exposed region was 1 μm, from which it is understandable that the amount of the anti-halation reagent is not decreased by the conditions of prebaking.

As Run No. 54, an image was printed and developed by repeating the procedure of Run No. 51 by using the same photoresist composition as in Run No. 51, except that the silicon wafer having a vacuum deposited aluminum layer was replaced by a silicon wafer having a silicon oxide film. Then the silicon oxide film was etched in the same manner as in Run No. 5 of Comparative Example 1. As a result, the side etch was 2.2 μm and the adhesion was good.

EXAMPLE 12

A photoresist composition was prepared by repeating the procedure of Example 1, except that 4-aminoazobenzene was replaced by 4-methyl-7-diethylaminocoumarin.

By using the photoresist composition thus prepared, an image was printed and developed on a silicon wafer having a deposited aluminum layer in the same manner as in Comparative Example 1. In all the cases, the yield of the residual resist thickness of the image formed was 90% or more. The results are shown in Table 13.

TABLE 13

| | Run No. | Amount of 4-methyl-7-diethylamino-coumarin (g) | Amount of xylene (g) | Exposure time (sec) | Degree of resolution (μm) | Length of exposed region (μm) |
|---|---|---|---|---|---|---|
| Example 12 | 55 | 0.33 | 88.2 | 3.0 | 2.2 | 1 |
| | 56 | 0.33 | 88.2 | 4.0 | 2.2 | 1-2 |
| | 57 | 0.66 | 87.8 | 5.0 | 2.2 | <1 |
| | 58 | 0.66 | 87.8 | 6.0 | 2.2 | <1 |

As Run No. 59, the same photoresist composition as in Run No. 55 was applied to a silicon wafer having a vacuum deposited aluminum layer in the same manner as in Comparative Example 1 and dried at 95° C. for 30 minutes, after which an image was printed and developed in the same manner as in Run No. 55. As a result, the degree of resolution was 2.2 μm and the length of the exposed region was 1 μm, from which it is understandable that the amount of the anti-halation reagent is not decreased by the conditions of prebaking.

As Run No. 60, an image was printed and developed in the same manner as in Run No. 56 by using the same photoresist composition as in Run No. 56, except that the silicon wafer having a vacuum deposited aluminum layer was replaced by a silicon wafer having a silicon oxide film. Then it was heat-treated at 150° C. for 30 minutes under an atmosphere of nitrogen and etched with the same etchant as in Run No. 5 of Comparative Example 1 at 25° C. for 30 minutes. As a result, the side etch was 2.2 μm, and the adhesion between the photoresist composition film and the base board was excellent.

What is claimed is:

1. A photoresist composition comprising a cyclized product of a conjugated diene polymer or copolymer, a photo-crosslinking agent soluble in an organic solvent and at least one member selected from the group consisting of compounds represented by the formulas:

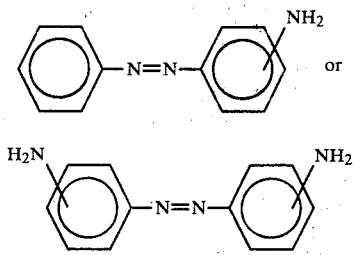

compounds represented by the formulas:

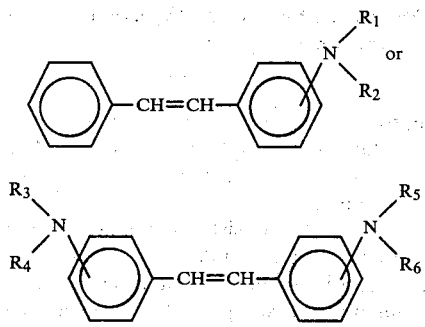

wherein $R_1$, $R_2$, $R_3$, $R_4$, $R_5$ and $R_6$, which may be identical or different, represent substituents selected from the group consisting of hydrogen atom and alkyl groups, compounds represented by the formula:

Ar—N=N—NH—Ar' wherein Ar and Ar', which may be identical or different, represent aromatic groups, and compounds represented by the formulas:

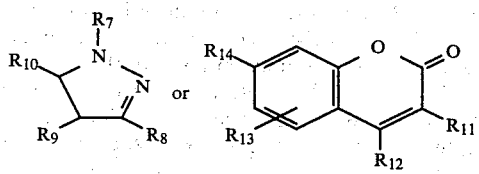

wherein $R_7$, $R_8$, $R_9$, $R_{10}$, $R_{12}$ and $R_{13}$, which may be identical or different, represent substituents selected from the group consisting of hydrogen atom, alkyl groups, alkenyl groups, aryl groups, and aralkyl groups; $R_{11}$ represents a substituent selected from the group consisting of hydrogen atom and aryl groups; and $R_{14}$ represents a substituent selected from the group consisting of hydrogen atom and amino group.

2. A photoresist composition according to claim 1, in which the compounds represented by the formulas are present in an amount of 0.1–10% by weight based on the weight of the cyclized product of a conjugated diene polymer or copolymer.

3. A photoresist composition according to claim 1 comprising a cyclized product of a conjugated diene polymer or copolymer, a photo-crosslinking agent soluble in an organic solvent and a compound represented by the formulas:

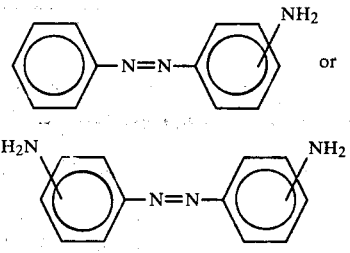

4. A photoresist composition according to claim 3, wherein the compound represented by one of the formulas is 2-aminoazobenzene, 3-aminoazobenzene, 4-aminobenzene, 2,2'-diaminoazobenzene, 2,4'-diaminoazobenzene or 4,4'-diaminoazobenzene.

5. A photoresist composition according to claim 1 comprising a cyclized product of a conjugated diene polymer or copolymer, a photo-crosslinking agent soluble in an organic solvent and a compound represented by the formulas:

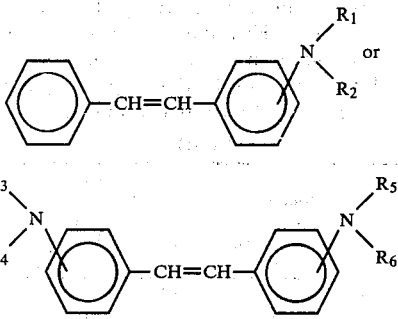

wherein $R_1$, $R_2$, $R_3$, $R_4$, $R_5$ and $R_6$, which may be identical or different, represent substituents selected from the group consisting of hydrogen atom and alkyl groups.

6. A photoresist composition according to claim 5, wherein the compound represented by one of the formulas is aminostilbene, 4,4'-diaminostilbene, 2,4'-diaminostilbene, dimethylaminostilbene, 4,4'-bis(dimethylamino)stilbene, 2,4'-bis(dimethylamino)stilbene, diethylaminostilbene, 4,4'-bis(diethylamino)stilbene, 2,4'-bis(diethylamino)stilbene or 4-amino-4'-(N,N-dimethylamino)stilbene.

7. A photoresist composition according to claim 1 comprising a cyclized product of a conjugated diene polymer or copolymer, a photo-crosslinking agent soluble in an organic solvent and a compound represented by the formula:

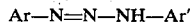

Ar—N=N—NH—Ar' wherein Ar and Ar', which may be identical or different, represent aromatic groups.

8. A photoresist composition according to claim 7, wherein the compound represented by the formula is diazoaminobenzene, 2,4'-dimethyldiazoaminobenzene, 2,4-dimethyldiazoaminobenzene, 4,4'-diethyldiazoaminobenzene, 4,4'-dinitrodiazoaminobenzene, 1,1'-diazoaminophthalene, 4,4'-dimethyl-1,1'-diazoaminonaphthalene, 4,4'-diethyl-1,1'-diazoaminonaphthalene, 4,4'-diethyl-1,1'-diazoaminonaphthalene or 4,4'-dinitro-1,1'-diazoaminonaphthalene.

9. A photoresist composition according to claim 1 comprising a cyclized product of a conjugated diene polymer or copolymer, a photo-crosslinking agent soluble in an organic solvent and a compound represented by the formulas:

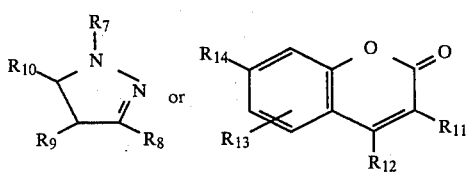

wherein $R_7$, $R_8$, $R_9$, $R_{10}$, $R_{12}$ and $R_{13}$, which may be identical or different, represent substituents selected from the group consisting of hydrogen atom, alkyl groups, alkenyl groups, aryl groups and aralkyl groups; $R_{11}$ is a hydrogen atom or an aryl group; and $R_{14}$ is a hydrogen atom or an amino group.

10. A photoresist composition according to claim 9, wherein the compound represented by the formulas is 1,3-diphenylpyrazoline, 1,3,5-triphenylpyrazoline, 1-phenyl-3-m-tolylpyrazoline, 1-m-tolyl-3-phenylpyrazoline, 1-phenyl-3-p-bromophenylpyrazoline, 1,3-di-m-tolylpyrazoline, 1,3-diphenyl-5-methylpyrazoline, 1,5-diphenyl-3-p-tolylpyrazoline, 1,5-diphenyl-3-p-methoxyphenylpyrazoline, 1,5-diphenyl-3-p-ethoxyphenylpyrazoline, 1,5-diphenyl-3-p-phenoxyphenylpyrazoline, 1,5-diphenyl-3-(p-phenyl)-phenylpyrazoline, 1,5-diphenyl-3-(p-ethoxy-m-methyl)-phenylpyrazoline, 1-phenyl-3,5-di(p-chlorophenyl)-phenylpyrazoline, 1,3-diphenyl-5-p-methoxyphenylpyrazoline, 1-phenyl-3-p-methoxyphenyl-5-p-tolylpyrazoline, 1-phenyl-3-p-tolyl-5-p-methoxyphenylpyrazoline, 1-phenyl-3,5-di(p-methoxyphenyl)-pyrazoline, 1,5-diphenyl-3-α-naphthylpyrazoline, 1,5-diphenyl-3-β-naphthylpyrazoline, 1,3,4,5-tetraphenylpyrazoline, 1,3,5,5-tetraphenylpyrazoline, 1,3,4-triphenylpyrazoline, 1,5-diphenyl-3-styrylpyrazoline, 1-β-naphthyl-3-styryl-5-phenylpyrazoline, 1-phenyl-3-chlorostyryl-5-phenylpyrazoline, 4-methyl-7-diethylaminocoumarin, 3-phenyl-7-acetylaminocoumarin, 3-p-tolyl-7-acetylaminocoumarin, 3-phenyl-4-methyl-7-diethylaminocoumarin, 3-p-tolyl-7-diethylaminocoumarin or 3-p-methoxyphenyl-4-ethyl-7-diethylaminocoumarin.

11. A photoresist composition according to any one of claims 1 to 10, wherein said cyclized product of a conjugated diene polymer or copolymer has, in its polymer chain, a unit represented by the formulas:

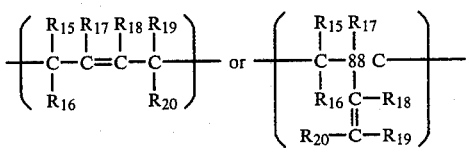

wherein $R_{15}$, $R_{16}$, $R_{17}$, $R_{18}$, $R_{19}$ and $R_{20}$, which may be identical or different, represent substituents selected from the group consisting of hydrogen atom, alkyl groups and aryl groups.

12. A photoresist composition according to claim 11, wherein said unit is cis-1,4-butadiene unit, trans-1,4-butadiene unit, cis-1,4-isoprene unit, trans-1,4-isoprene unit, cis-1,4-pentadiene unit, trans-1,4-pentadiene unit, 1,4-2-phenylbutadiene unit, 1,2-butadiene unit, 3,4-isoprene unit, 1,2-pentadiene unit or 3,4-2-phenylbutadiene unit.

13. A photoresist composition according to any one of claims 1 to 10, wherein said photo-crosslinking agent soluble in an organic solvent is an azide type photosensitive substance.

14. A photoresist composition according to claim 13, wherein said azide type photosensitive substance is 4,4'-diazidostilbene, p-phenylenebisazide, 4,4'-diazidobenzophenone, 4,4'-diazidophenylmethane, 4,4'-diazidochalcone, 2,6-bis(4'-azidobenzal)-cyclohexanone, 2,6-bis(4'-azidobenzal)-4-methylcyclohexanone, 4,4'-diazidodiphenyl, 4,4'-diazido-3,3'-dimethyldiphenyl or 2,7-diazidofluorene.

15. A photoresist composition according to any one of claims 1 to 10, wherein the amount of residual double bond in said cyclized product of the conjugated diene polymer or copolymer is 5-95%.

16. A photoresist composition according to claim 15, wherein said amount of residual double bond is 15-50%.

17. A photoresist composition according to any one of claims 1 to 10, wherein said cyclized product of the conjugated polymer or copolymer is a cyclized product of isoprene polymer or butadiene polymer.

* * * * *